United States Patent [19]

Sucheski et al.

[11] Patent Number: 4,975,066

[45] Date of Patent: Dec. 4, 1990

[54] COAXIAL CONTACT ELEMENT

[75] Inventors: Matthew M. Sucheski, Harrisburg; Lee A. Barkus, Millersburg, both of Pa.

[73] Assignee: AMP Incorporated, Harrisburg, Pa.

[21] Appl. No.: 372,403

[22] Filed: Jun. 27, 1989

[51] Int. Cl.[5] .................... H05K 1/00

[52] U.S. Cl. .................... 439/63; 439/751; 439/668; 439/699

[58] Field of Search .................... 439/578-585, 439/675, 668, 669, 63, 851-858, 741, 751, 699

[56] References Cited

U.S. PATENT DOCUMENTS

| | | | |
|---|---|---|---|
| 4,494,816 | 1/1985 | Tamburro | 439/581 |
| 4,605,269 | 8/1986 | Cohen | 439/63 |
| 4,759,729 | 7/1988 | Kemppainen et al. | 439/581 |
| 4,846,719 | 7/1989 | Iwashita | 439/63 |

FOREIGN PATENT DOCUMENTS

| | | | |
|---|---|---|---|
| 1148628 | 6/1983 | Canada | 439/63 |
| 2104312 | 3/1983 | United Kingdom | 439/63 |

*Primary Examiner*—David L. Pirlot
*Attorney, Agent, or Firm*—Allan B. Osborne

[57] ABSTRACT

A coaxial contact element for use in receptacle connectors of the type used with printed circuit cards and the like. More particularly the contact element includes an inner contact for being electrically mated with a center contact of a post and an outer contact for being electrically mated with outer contacts of the post. A dielectric spacer electrically isolates the inner and outer contacts of the contact element.

9 Claims, 3 Drawing Sheets

COAXIAL CONTACT ELEMENT

FIELD OF THE INVENTION

The present invention relates to a contact element having two electrically isolated contacts for electrically engaging a post or pin having two electrically isolated contact surface.

BACKGROUND OF THE INVENTION

It is well known in the art that high speed and high frequency signals three adjacent conductors interfere with each other and the signals degenerate. It is also well known in the art that when the conductors are shielded from each other, the interference is substantially reduced or even eliminated. Early examples of this is the well known coaxial cable and connectors that terminated such cable as shown in U.S. Pat. No. 4,070,751. As the use of two piece connector systems; e.g., the Eurocard connector, with printed circuit boards for high speed applications developed, the shielding concept was adopted by some workers as shown in U.S. Pat. No. 4,451,107 wherein the ground reference was provided by a die cast zinc housing. Other workers retained the dielectric housings for ease of manufacturing and cost and provided shielding by dedicating selected contact elements and posts. In U.S. Pat. No. 4,655,518, the patentees placed ground contacts along the outside of the rows of posts in the header and along the outside walls of the receptacle of their two piece connector system. This arrangement went a long way toward solving a "ground bounce" problem. More recently, workers have developed an even more powerful connector system wherein shielding plates are provided between adjacent rows of signal contacts. These arrangements; disclosed in U.S. Pat. No. 4,846,727 and application Ser. No. 07/367,929 filed June 19, 1989, permit the user to dedicate all contact elements and posts to carrying signals without a degradation thereof.

It is now proposed to provide coaxial contact elements for use in dielectric housings in which a signal carrying contact is surrounded by a ground reference contact.

SUMMARY OF THE INVENTION

According to the invention, a coaxial contact element is provided which includes first and second contacts with each having an intermediate section, a receptacle section extending outwardly from one end of the intermediate section and a lead extending outwardly from an opposite end. The intermediate section of the first contact is positioned within the intermediate section of the second contact with the respective receptacle sections and leads extending outwardly from the respective intermediate sections so as not to electrically engage each other. A dielectric spacer electrically isolates the respective intermediate sections.

DESCRIPTION OF THE INVENTION

Figure 1:
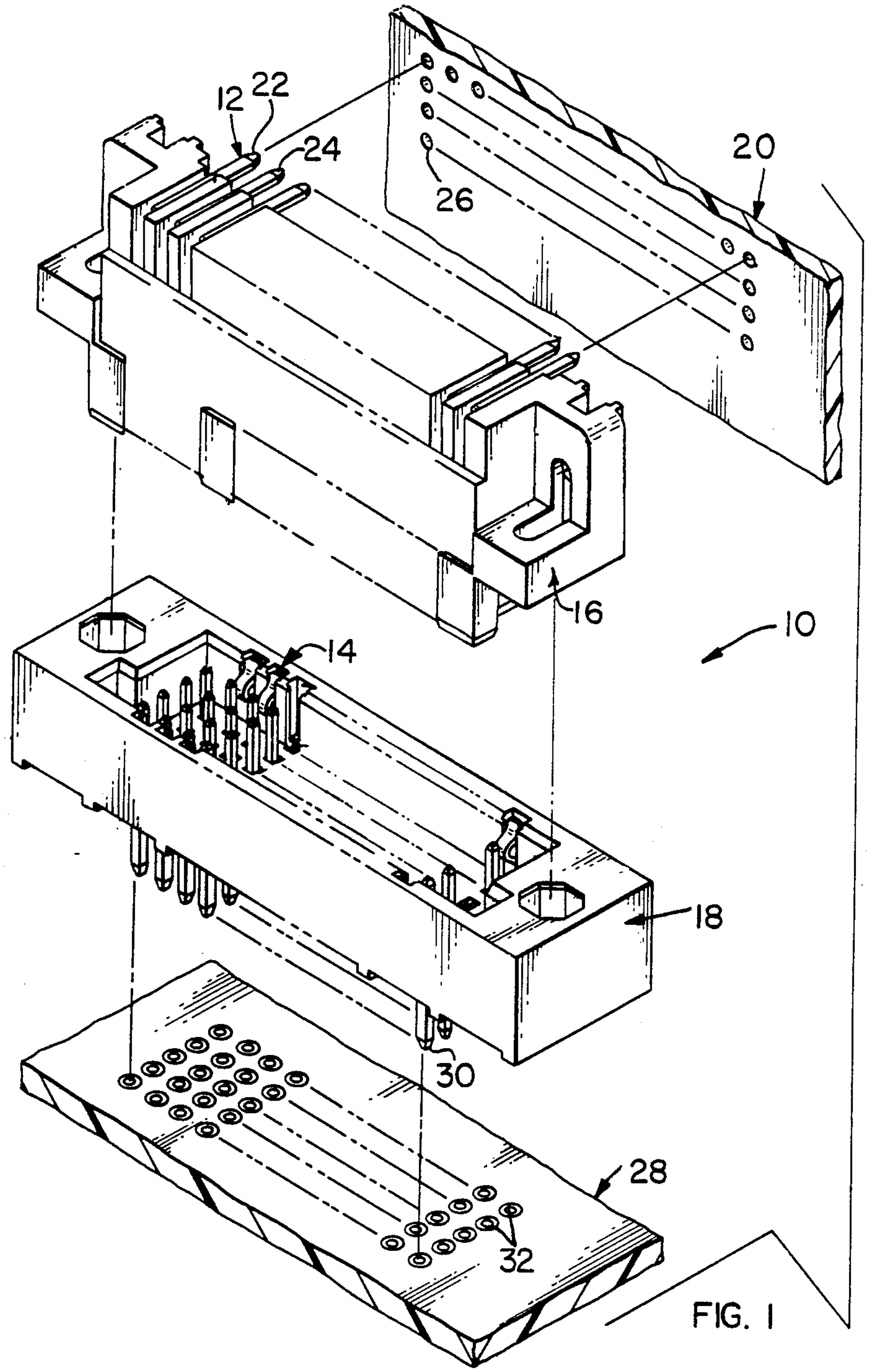
FIG. 1 is a perspective view of a two piece Eurocard connector in which the coaxial contact element of the present invention may be used.
Figures 2, 3:
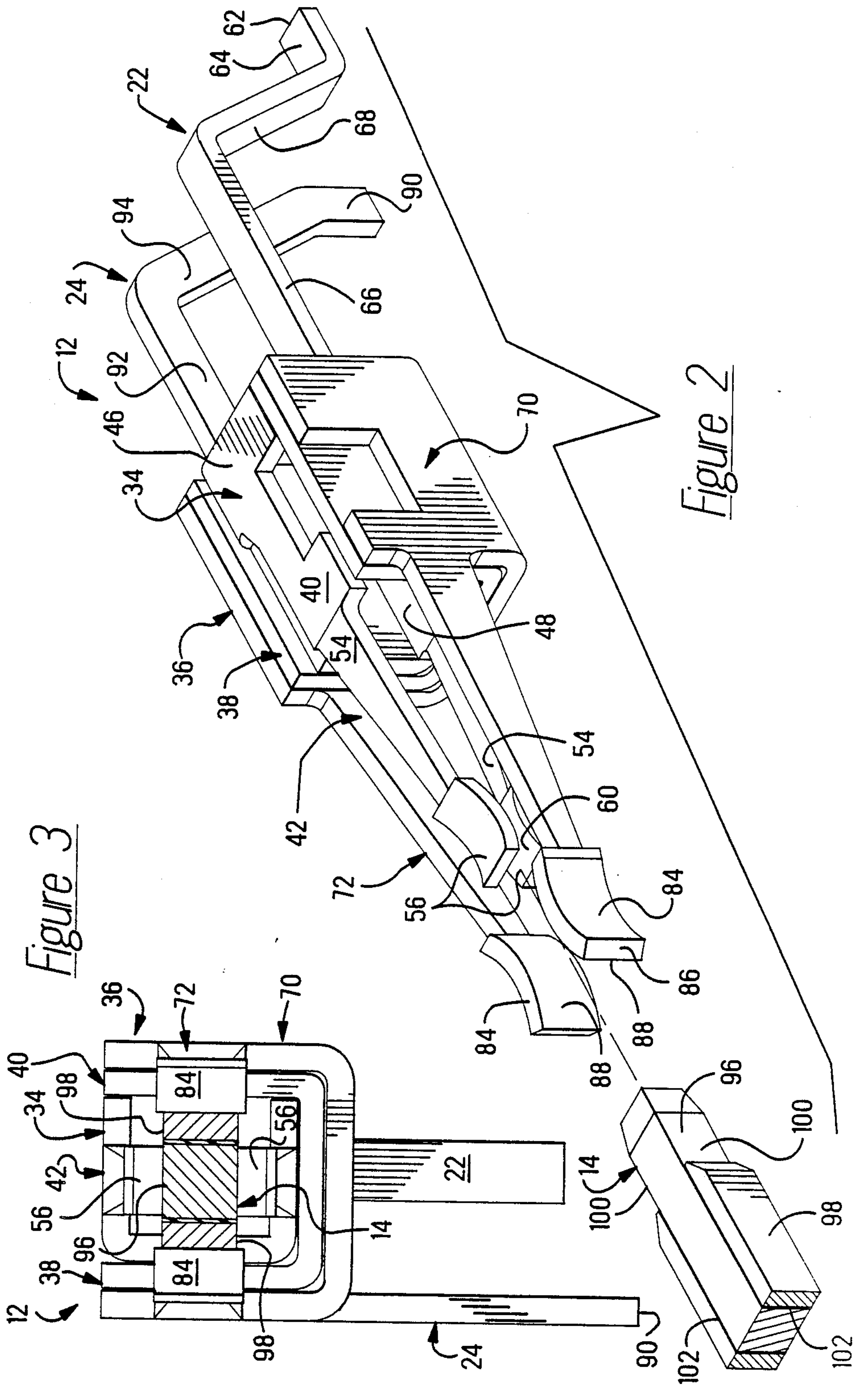
FIG. 2 is a perspective view of the coaxial contact element and post of the present invention.
FIG. 3 is an end sectional view of the coaxial contact element with the post inserted therein.

The Eurocard connector 10 shown in FIG. 1 exemplifies the type of electrical devices in which coaxial contact element 12 and post 14, both shown in FIG. 2, are well suited. Connector 10 includes receptacle 16 in which contact elements 12 would be housed. Connector 10 further includes header 18 in which posts 14 would be housed. As is well known, daughter card 20 attaches to receptacle 16 with leads 22, 24 of elements 12 being electrically terminated in plated-through holes 26 or on circuit paths (not shown). Similarly, header 18 mounted on back panel 28 with leads 30 of posts 14 being electrically terminated in plated-through holes 32. Electronic components on card 20 (not shown) are electrically connected to other electronic components on other cards (not shown) through circuits (not shown) on panel 28 by plugging receptacles 16 into headers 18.

Figure 4:
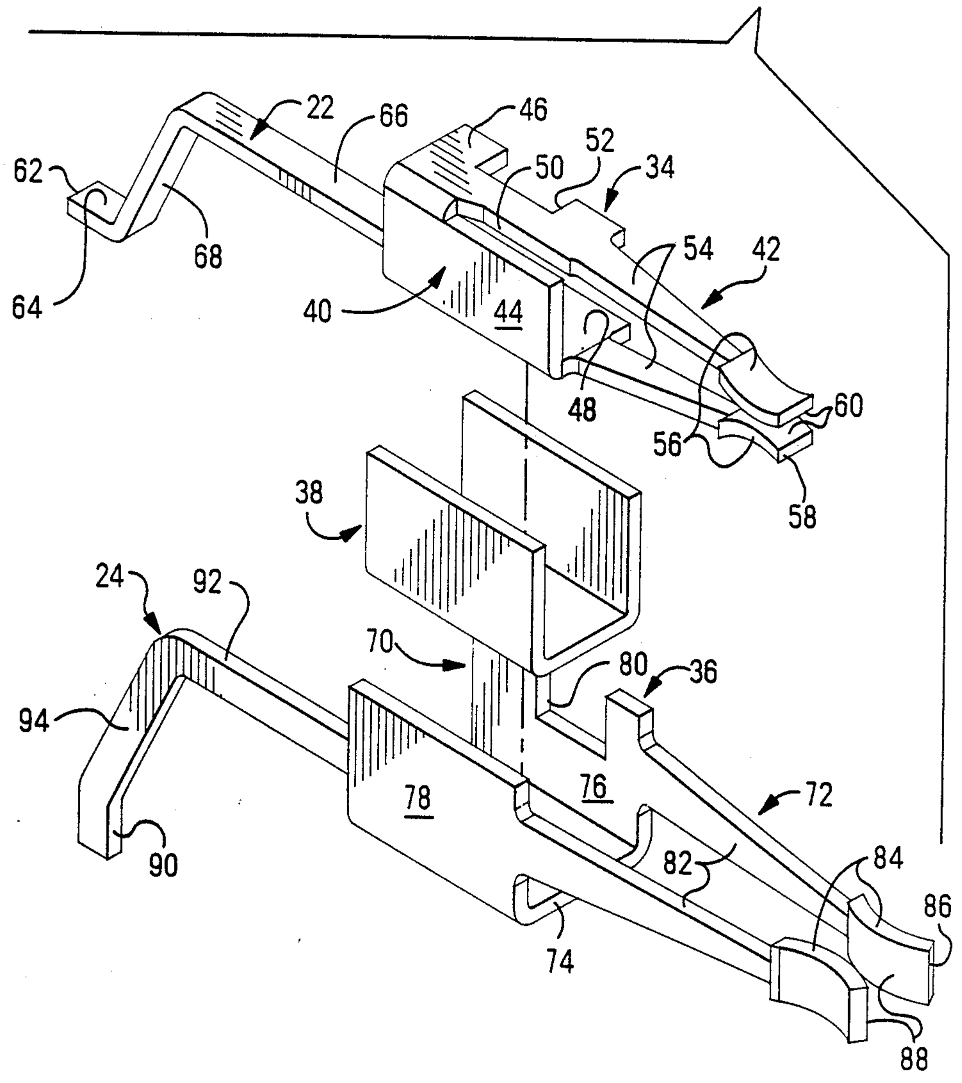
FIG. 4 is an exploded perspective view of the coaxial contact element.

As shown in FIGS. 2 and 4, coaxial contact element 12 includes a first contact 34 nested within second contact 36 and electrical isolated therefrom by a dielectrical spacer 38. First contact 34 includes intermediate section 40, a twin beam receptacle section 42 extending outwardly from one end of intermediate section 40 and lead 22 extending outwardly from another end.

Intermediate section 40 of contact 12 is C-shaped as viewed from one end and as can be seen in FIG. 3. Bight 44 is partially separated from adjacent side portions 46, 48 by slots 50 so that it can be bent outwardly. Notch 52 is provided in side portion 46.

Receptacle section 42 is defined by parallel, converging beams 54 extending outwardly from respective side portions 46, 48. Arcuate shaped pads 56 are provided at the free ends 58 of beams 54 with convex surfaces 60 facing each other.

Lead 22 includes at its free end 62 a solder foot 64 which is displaced from first portion 66 by second portion 68. First portion 66 is attached at one end to side portion 48.

Second contact 36 includes intermediate section 70, a twin beam receptacle section 72 extending outwardly from one end of intermediate section 70 and lead 24 extending outwardly from another end.

Intermediate section 70 of contact 36 is C-shaped as defined by bight 74 and side portions 76, 78. Notch 80 is provided in side portion 76.

Receptacle section 70 includes parallel, converging beams 82 which extend outwardly from respective side portions 76, 78. Arcuate shaped pads 84 are located at free ends 86 of respective beams 82 with convex surfaces 88 facing each other.

Lead 24 extending outwardly from side portion 78 and includes free end 90 which is adopted to be inserted into plated through hole 26 in card 20. Free end 90 is displaced from and at right angles to first portion 92 by reason of second portion 94.

Both contacts 34 and 36 are stamped and formed from a suitable conductive material such as phosphor bronze.

Dielectric spacer 38 is C- or channel-shaped and is dimensioned to fit within intermediate section 70 of contact 36 and to receive intermediate section 40 therein. Spacer 38 is made from a suitable dielectric material such as kapton film.

Post 14, shown in FIGS. 2 and 3, includes a center contact surface 96, outer contact surfaces 98 on opposing sides 100 of post 14 and dielectric spacers 102 isolating contact surface 96 from contact surfaces 98. Lead 30 (FIG. 1) is not shown in detail but would have a similar structure; e.g., the outer contact surfaces would engage circuits on panel 28, and the center contact surface would be wire-wrapped.

As shown in FIGS. 2 and 3, dielectric spacer 38 is positioned in intermediate section 70 of second contact 36 and receives intermediate section 40 of first contact 34. Receptacle section 42 of contact 34 lies between beams 82 of contact 36 and are oriented so that the plane of pads 56 are at ninety degrees relative to pads 84. Leads 22, 24 extending outwardly from respective intermediate sections 40, 70 and are spaced from each other to avoid contact therebetween. Side portion 44 of intermediate section 40 may be bent out obliquely to provide an interfering fit within spacer 38.

As can be seen from FIGS. 2 and 3, post 14 is received in contact element 12 with center contact 96 engaging convex surfaces 60 on pads 56 of contact 34 and with outer contacts 98 engaging convex surfaces 88 on pads 84 of contact 36.

The particular orientation of receptacle sections 42, 72 as shown is preferred but can be changed if desired. Beams 54, 82 are resilient and should be able to accept a reasonable range of posts 14 sizes without taking a set. The preferred material mentioned above provides this elasticity.

In use, contact 34 would normally carry signals and contact 36 would provide a ground reference for signal integrity. However, in low frequency situations, contact 36 could be dedicated to power usage.

Leads 22, 24 shown on contacts 34, 36 respectively are for illustrational purposes only. This is, other type leads (not shown but well known to those shielded in the art) can be effectively used on contacts 34, 36 in lieu of leads 22, 24.

Similarly, receptacle sections 42, 72 may be of other structures to receive posts 14 of other structures.

Dimensional changes may be easily incorporated into contact element 12 and post 14. For example, both can be dimensioned to ensure that the second contact 36 engages outer contact 98 on post 14 before first contact 34 engages center contact 96.

As can be discussed, a coaxial contact element has been disclosed for mating with a post having electrically isolated inner and outer contacts. The contact element includes two, twin beam contacts with one nested within the other and electrically isolated therefrom by a dielectric spacer. Leads extend rearwardly from each contact for engaging circuits on a printed circuit card or the like. Twin, cantilever beams on each contact include enlarged pads for gripping a post inserted into the contact element.

We claim:

1. A coaxial contact element having electrically separate receptacle means for simultaneously electrically engaging electrically isolated center and outer contact surfaces on a single electrical terminal member, said contact element comprising:

a first contact disposed within a second contact and having a first intermediate section from which one receptacle means extends;

said second having a second intermediate section from which another receptacle means extends, said second intermediate section being channel-shaped with one open side for laterally receiving said first intermediate section and for completely supporting said first contact, said respective receptacle means extending outwardly from respective intermediate sections in electrical non-interfering paths; and dielectric film disposed between and engaging respective intermediate sections to thereby electrically isolate said first and second contacts from each other.

2. The coaxial contact element of claim 1 wherein said first intermediate section is channel-shaped.

3. The coaxial contact element of claim 2 wherein respective receptacle means include a pair of cantilever beams extending outwardly from opposite sides of respective intermediate sections.

4. The coaxial contact element of claim 3 wherein said pair of cantilever beams on one of said contacts are oriented ninety degrees relative to said pair of cantilever beams on another of said contacts.

5. The contact element having two pairs of electrically separated cantilever beams for concurrent electrical engagement with an electrical post having a pair of electrically separate contact areas, said contact element comprising:

a first C-shaped intermediate section with one pair of cantilever beams attached to opposite sides and extending outwardly therefrom;

a second C-shaped intermediate section with another pair of cantilever beams attached to opposite sides and extending outwardly therefrom, said first C-shaped intermediate section being laterally inserted into and fully supported by said second U-shaped intermediate section, said intermediate sections being orientated with respect to each other so that said pairs of cantilever beams are turned ninety degrees to each other; and dielectric film means positioned between and engaging respective intermediate sections to electrically isolate said intermediate sections from each other.

6. The contact element according to claim 5 wherein said pairs of cantilever beams are attached to one end of respective intermediate sections and further including leads attached to opposite ends of respective intermediate sections and extending outwardly therefrom for electrically engaging other electrical components.

7. The contact element according to claim 5 wherein said first C-shaped intermediate section includes parallel side portions to which said cantilever beams are attached and a bight extending between and attached to said side portions and further with a slot extending between a length of said bight and one side portion whereby said one side portion may be bent laterally.

8. The contact element according to claim 5 wherein each pair of said cantilever beams converge towards a free end.

9. The contact element according to claim 8 wherein each cantilever beam includes arcuate-shaped pads on each said free end with a convex surface on one beam of each pair facing a convex surface on the other beam.

* * * * *